(12) United States Patent
Linares Rivas et al.

(10) Patent No.: US 11,528,824 B2
(45) Date of Patent: Dec. 13, 2022

(54) BRACKET ASSEMBLIES FOR PCI CARDS

(71) Applicant: ARRIS Enterprises LLC, Suwanee, GA (US)

(72) Inventors: Oswaldo Enrique Linares Rivas, Guadalupe (MX); Julio Cesar Ayala Vera, Apodaca (MX); Sergio Antonio Delon Canseco, Guadalupe (MX); Carlos Paul Gonzalez Inda, Guadalupe (MX); Luis Carlos Lopez Moreno, Apodaca (MX)

(73) Assignee: ARRIS Enterprises LLC, Suwanee, GA (US)

( * ) Notice: Subject to any disclaimer, the term of this patent is extended or adjusted under 35 U.S.C. 154(b) by 0 days.

(21) Appl. No.: 17/363,539

(22) Filed: Jun. 30, 2021

(65) Prior Publication Data

US 2021/0410316 A1 Dec. 30, 2021

Related U.S. Application Data

(60) Provisional application No. 63/046,573, filed on Jun. 30, 2020.

(51) Int. Cl.
*H05K 7/14* (2006.01)
(52) U.S. Cl.
CPC ......... *H05K 7/1489* (2013.01); *H05K 7/1427* (2013.01)
(58) Field of Classification Search
None
See application file for complete search history.

(56) References Cited

U.S. PATENT DOCUMENTS

| 5,909,359 | A  | * | 6/1999  | Summers | H05K 7/1429 |
|-----------|----|---|---------|---------|-------------|
|           |    |   |         |         | 206/706     |
| 2009/0152416 | A1 | * | 6/2009 | Kim    | H05K 5/0204 |
|           |    |   |         |         | 248/205.1   |
| 2014/0106595 | A1 | * | 4/2014 | Zhu    | H01R 13/62  |
|           |    |   |         |         | 439/345     |
| 2014/0313646 | A1 | * | 10/2014| Lee    | G06F 1/185  |
|           |    |   |         |         | 361/679.01  |

(Continued)

FOREIGN PATENT DOCUMENTS

CN 201965523 U * 9/2011 ............ G06F 1/186

*Primary Examiner* — James Wu
*Assistant Examiner* — Christopher L Augustin
(74) *Attorney, Agent, or Firm* — Chernoff, Vilhauer, McClung & Stenzel, LLP

(57) ABSTRACT

Support bracket and support bracket assemblies for a peripheral component interconnect (PCI) card are shown and disclosed. In one embodiment, the support bracket includes a first planar member having opposed first and second end portions, and a second planar member attached to, or formed with, the second end portion. The second planar member is perpendicular to the first planar member and is attachable to an I/O PCI bracket. The support bracket additionally includes a ledge attached to, or formed with, the first planar member. The ledge extends between the first and second end portions and is perpendicular to the first and second planar members. The ledge is sized to support an end portion of the PCI card when the PCI card is attached to the I/O PCI bracket and when the second planar member is attached to the I/O PCI bracket.

12 Claims, 4 Drawing Sheets

(56) References Cited

U.S. PATENT DOCUMENTS

2014/0340834 A1\* 11/2014 Lee .................. G06F 1/185
 29/829
2017/0153675 A1\* 6/2017 Yang ................ G06F 1/187

\* cited by examiner

BRACKET ASSEMBLIES FOR PCI CARDS

CROSS REFERENCE TO RELATED APPLICATIONS

This application claims the benefit of U.S. Provisional Patent Application Ser. No. 63/046,573 filed Jun. 30, 2020.

BACKGROUND

The subject matter of this application relates to brackets and bracket assemblies for peripheral component interconnect (PCI) cards (such as PCI express cards or PCIe cards), in particular to brackets and bracket assemblies that support PCI cards when the PCI cards are mounted inside a computer or server chassis.

Computers include motherboards having PCI slots that receive PCI cards. PCI cards typically are mounted inside the computer or server chassis using a I/O PCI bracket, which is typically made of sheet metal. The I/O PCI bracket is fixed to the chassis and one of the ends of the PCI card is attached to the bracket via screws. However, the I/O PCI bracket provides support for only one side of the PCI card, which may lead to damage of the PCI card during handling or operation.

What is desired, therefore, is a support bracket that can be used in conjunction with the I/O PCI bracket to provide additional support to the PCI card.

BRIEF DESCRIPTION OF THE DRAWINGS

For a better understanding of the invention, and to show how the same may be carried into effect, reference will now be made, by way of example, to the accompanying drawings, in which.

DETAILED DESCRIPTION

Figure 1:
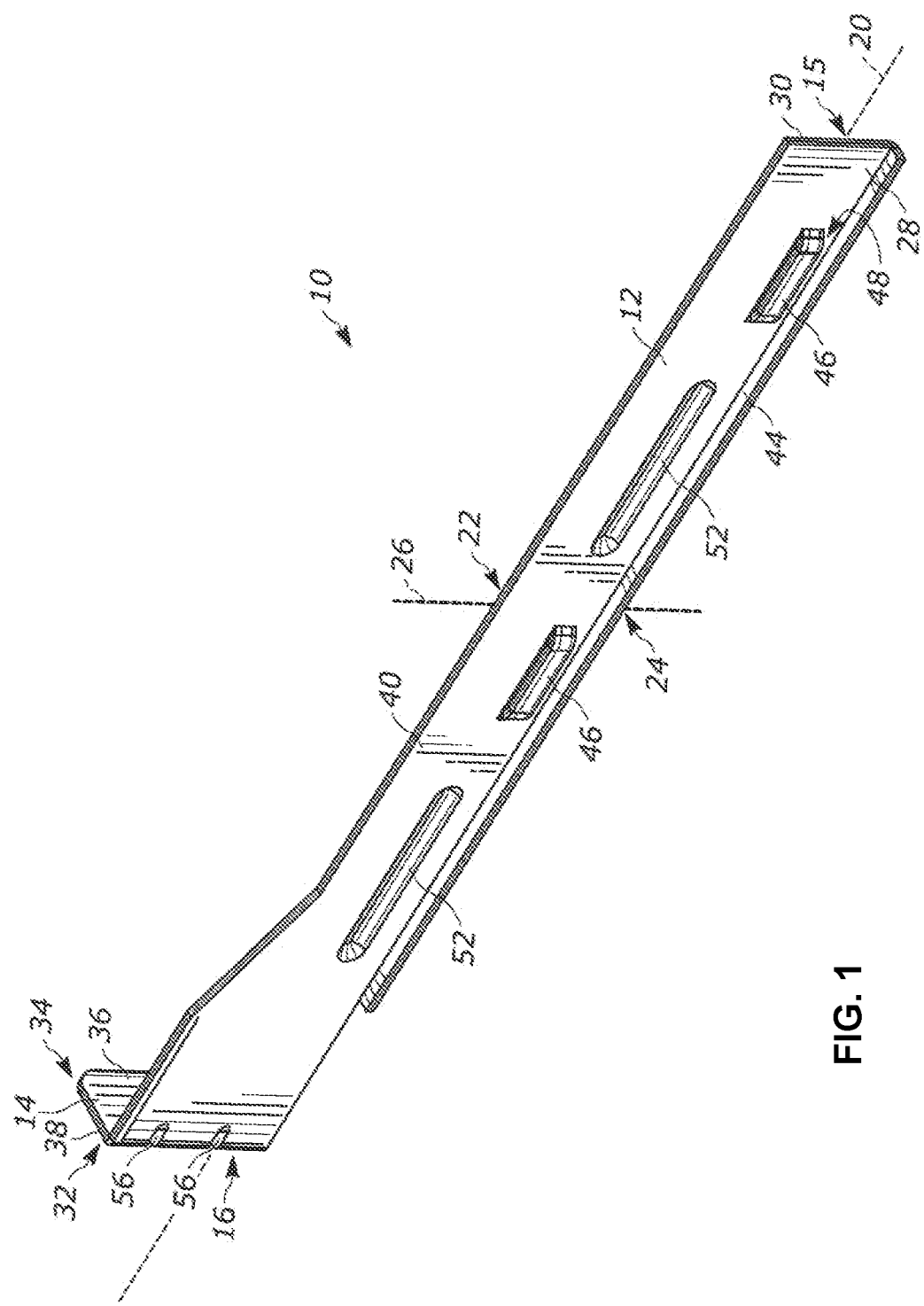
FIG. 1 is an isometric view of an example of a support bracket for a PCI card.
Figure 2:
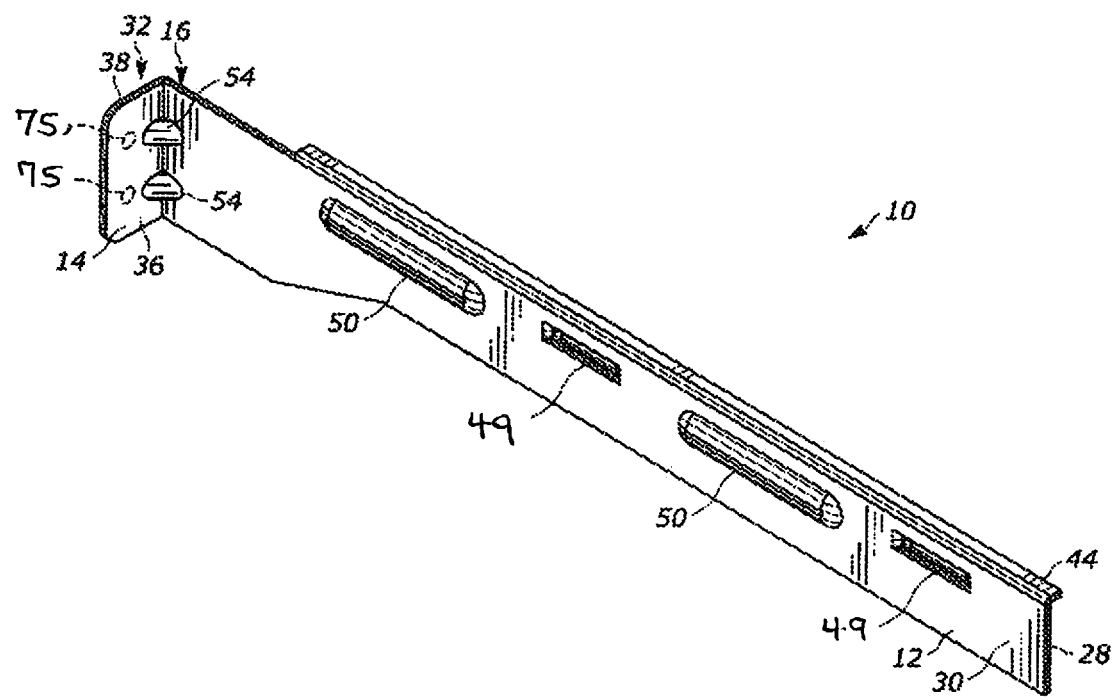
FIG. 2 is another isometric view of the support bracket of FIG. 1.

Referring to FIGS. 1-2, an example of a support bracket 10 is shown. The support bracket includes an elongate first portion or first member 12 and a second portion or second member 14 attached to, or formed with, the first member. First member 12 includes opposed first end and second end portions 15, 16 along a longitudinal axis 20. Additionally, first member 12 includes opposed third and fourth end portions 22, 24 along a transverse axis 26. First member 12 also includes opposed first and second sides 28, 30. Additionally, second member 14 includes opposed first end and second end portions 32, 34. Second member 14 also includes opposed third and fourth sides 36, 38.

First end portion 32 of second member 14 is attached to, or formed with, second end portion 16 of first member 12 on second side 30 of the first member. In the example shown in FIGS. 1-2, second member 14 is transverse or perpendicular to first member 12. However, in other embodiments, second member 14 may not be transverse or perpendicular to first member 12. For example, the first and second members may form an obtuse angle. Fourth side 38 of second member 14 is attachable or configured to be attached to an I/O PCI bracket (such as a full height I/O PCI bracket), as further discussed below.

In some embodiments, first and second members 12, 14 may collectively be referred to as an "L"-shaped base 40 having a first member or portion 12 and a second member or portion 14. In other embodiments, second member 14 may be attached to, or formed with, first member 12 to form shapes other than an "L" shape. For example, a center portion, or other portion between the third and fourth end portions, of second member 14 may be attached to, or formed with, the second end portion of first member 12 to form a "T"-shaped base. In the example shown in FIGS. 1-2, first and second members 12, 14 are generally flat or planar members and thus may sometimes be referred to as "first planar member 12" and "second planar member 14." In other words, the height or thickness of each of the first and second members is substantially smaller than the length and/or width. However, in other embodiments, the first and/or second members may not be flat or may have a height or thickness that is not substantially smaller than the length and/or width.

Support bracket 10 also includes a shelf or ledge 44 that is attached to, or formed with, fourth end portion 24 of first member 12 on first side 28. The ledge is sized to support an end portion of a PCI card, such as when the PCI card is attached to an I/O PCI bracket and the second member is attached to the I/O PCI bracket. For example, an end portion of a PCI card may rest or contact the ledge when the PCI card is attached to an I/O PCI bracket and the second member is attached to the I/O PCI bracket. The ledge may have a width (i.e., amount that the ledge extends away from first side 28) that is two, three, or four times the thickness of first member 12. Additionally, ledge 44 may have a length (i.e., amount that the ledge extends parallel to first side 28) that is substantially the length of first member 12, such as about 70%, 80%, or 90% of the length of first member 12. In the example shown in FIGS. 1-2, ledge 44 extends from first end portion 15 toward second end portion 16. However, in other embodiments, the ledge may extend from a different portion of first member 12, such as attached to, or formed with, a portion that is offset or spaced from the first end portion. For example, ledge 44 may alternatively extend from a portion offset or spaced from the first end portion to second end portion 16, or from a portion offset or spaced from the first end portion to a portion offset or spaced from the second end portion.

In the example shown in FIGS. 1-2, ledge 44 is transverse or perpendicular to the first and second members. However, in other embodiments, ledge 44 may not be transverse or perpendicular to the first and/or second members so long as the ledge can still support an end portion of a PCI card when the PCI card is attached to an I/O PCI bracket and the second member is attached to the I/O PCI bracket. Additionally, in other embodiments, ledge 44 may be attached to, or formed with, first side 28 of first member 12 other than to fourth end portion 24 so long as the ledge supports an end portion of a PCI card when the PCI card is attached to an I/O PCI bracket and the second member is attached to the I/O PCI bracket. For example, when first member 12 has a height larger than shown in FIGS. 1-2, ledge 44 may be attached to, or formed with, first side 28 of first member 12 between the third and fourth end portions of the first member. In the example shown in FIGS. 1-2, support bracket 10 is shown to include a single ledge. However, in other embodiments, support bracket 10 may two or more discrete ledges 44 each spaced from an adjacent ledge. First member 12, second member 14, and ledge 44 may be made of any suitable materials, such as sheet metal and/or plastic.

Additionally, in the example shown in FIGS. 1-2, support bracket 10 includes one or more first projections 46 that are attached to, or formed with, first side 28 of first member 12. The first projection(s) are positioned on the first side of first member 12 such that ledge 44 and first projections 46 defines a channel 48 therebetween. Channel 48 is sized to receive an end of a PCI card, such as when the PCI card is attached to an I/O PCI bracket and when the second member is attached to the I/O PCI bracket. In some examples, the first projection(s) may be positioned such that channel 48 is just large enough to receive an end of a PCI card (i.e., the end of the PCI card received in channel 48 contacts ledge 44, a portion of first side 28 between the ledge and the one or more first projections, and one or more of the first projections). In other examples, first projections 46 are spaced or positioned on the first side such that channel 48 is larger than an end of the PCI card (i.e., the end of the PCI card received in channel 48 contacts only ledge 44 and a portion of the first side between the ledge and the one or more first projections and not the first projection(s)).

In the example shown in FIGS. 1-2, support bracket 10 includes two first projections 46. However, other examples may include only one first projection 46 or three or more first projections 46. Additionally, the first projections may be any suitable length(s), and the first projections may have the same length or may have a different length from one or more of the other first projections. In an alternative embodiment, support bracket may, for example, have a single first projection 46 with a length that extends between the first end portion and the second end portion of the first member, such as the same or similar length as ledge 44. Additionally, when support bracket has two or more first projections 46, those first projections may be spaced from each other any suitable length(s). In other words, the gaps between the first projections may be any suitable size or length and those gaps may be the same and/or different from each other. When first member 12 is made of sheet metal or other suitable materials, first projections 46 on first side 28 may be made by pushing out, pressing, or punching portions of second side 30 to form first cavities or indentations 48 that correspond to the first projections on the first side.

Moreover, in the example shown in FIGS. 1-2, support bracket 10 includes one or more second projections 50 that are attached to, or formed with, second side 30 of first member 12. The second side may include suitable number of second projections. In the example shown in FIGS. 1-2, support bracket 10 includes two second projections 50. However, other examples may include only one second projection 50 or three or more second projections 50. Additionally, the second projections may be any suitable length(s), and the second projections may have the same length or may have a different length from one or more of the other second projections. Moreover, when support bracket has two or more second projections 50, those second projections may be spaced from each other any suitable length(s). In other words, the gaps between the second projections may be any suitable size or length and those gaps may be the same and/or different from each other.

When first member 12 is made of sheet metal or other suitable materials, second projections 50 on second side 30 may be made by pushing out, pressing, or punching portions of first side 28 to form second cavities or indentations 52 that correspond to the second projections on the second side. The second projections provide more rigidity and prevents deformation of the support bracket 10. When punching is used to form the second projections, the second projections may be referred to as "punching features" of the support bracket. The second projections may be positioned on any suitable portions of the second side of the first member. In the example shown in FIGS. 1-2, second projections 50 are positioned about halfway along the width of the first member (i.e., along the transverse axis). However, other embodiments may include second projections positioned higher or lower along the transverse axis. Indentations 52 may be spaced from first projections 46 on the first side of the first member, while indentations 49 may be spaced from second projections 50 on the second side of the first member. In the example shown in FIGS. 1-2, first projections 46 and indentations 52 alternate on the first side, while indentations 49 and second projections 50 alternate on the second side. However, other embodiments may include two or more first projections before any indentations 52 on the first side, or two or more second projections before any indentations 49 on the second side.

Furthermore, in the example shown in FIGS. 1-2, support bracket 10 includes one or more third projections 54 that are attached to, or formed with, second side 30 at second end portion 16 of first member 12 and third side 36 of second member 14. In other words, the third projection(s) extend from or span second side 30 at second end portion 16 of first member to third side 36 of second member 14 (i.e., the third projections contact both the second side of first member 12 and the third side of second member 14). The third projections provide rigidity and prevent deformation of the support bracket, such as along the intersection of the first and second members to prevent bending of the second member relative to the first member, or vice-versa.

In the example shown in FIGS. 1-2, support bracket 10 includes two third projections 54. However, other examples may include only one third projection 54 or three or more third projections 54. Additionally, the third projections may be any suitable length(s), and the third projections may have the same length or may have a different length from one or more of the other third projections. When support bracket 10 has two or more third projections 54, those third projections may be spaced from each other any suitable length(s). In other words, the gap(s) between the third projections may be any suitable size or length and those gap(s) may be the same and/or different from each other. When first member 12 and second member 14 are made of sheet metal or other suitable materials, third projections 54 may be made by pushing out, pressing, or punching portions of first side 28 along first end portion 15 of first member 12 and fourth side 38 of second member 14 to form third cavities or indentations 56 on first side 28 and fourth side 38 that correspond to the third projections on second side 30 and third side 36.

Figure 3:
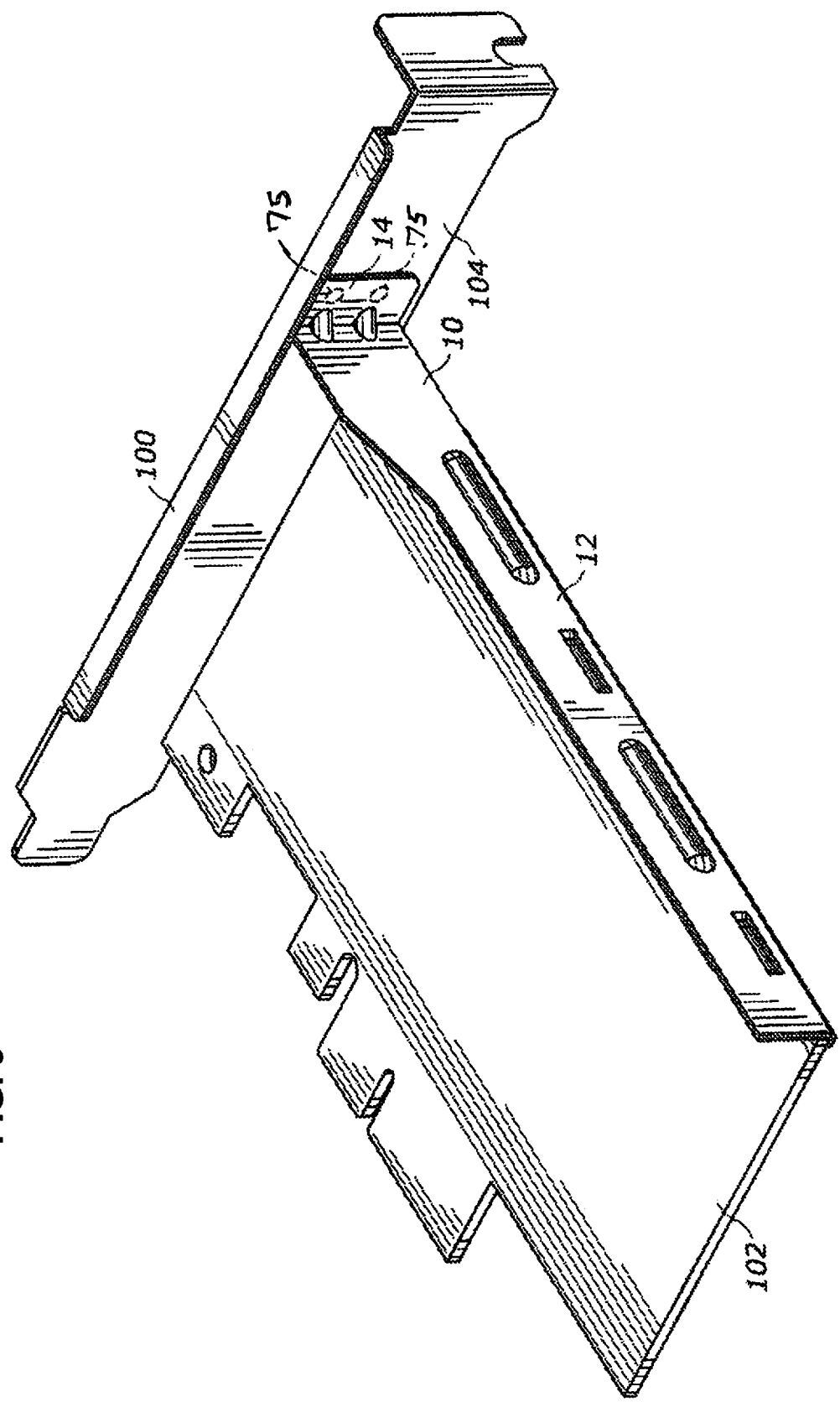
FIG. 3 is an isometric view of the support bracket of FIG. 1 shown attached to an I/O PCI bracket and supporting a PCI card.
Figure 4:
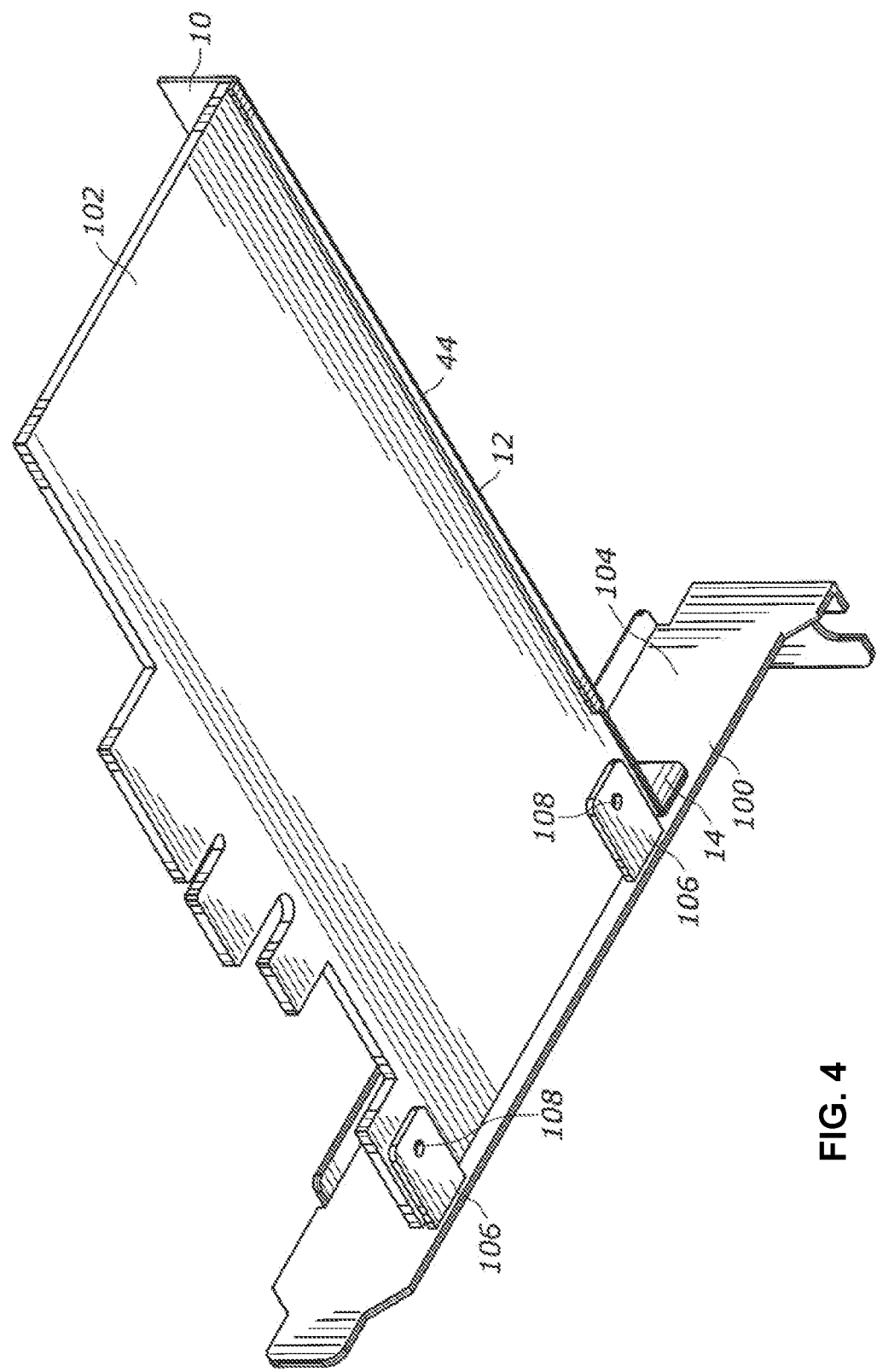
FIG. 4 is another isometric view of the support bracket, I/O PCI bracket, and PCI card of FIG. 3.

Referring to FIGS. 3-4, an I/O PCI bracket 100 is shown used in combination with support bracket 10 to support a PCI card 102. The I/O PCI bracket includes an elongate base 104, two spaced tabs 106 that are attached to, or formed with, the elongate base. Tabs 106 are perpendicular or transverse to the elongate base. Additionally, each of tabs 106 includes an aperture 108 sized to receive a fastener to attach PCI card 102 to the I/O PCI bracket. Second member 14 of support bracket 10 is attached to elongate base 104 of I/O PCI bracket 100 via any suitable means. For example, second member 14 may include openings 75 to receive fasteners (e.g., screws and/or rivets) to attach the second member to the I/O PCI bracket. Alternatively, second member 14 may be attached to the I/O PCI bracket via clinching or other similar methods. Other means of attachment may be used, including spot welding, adhesives, etc. When support bracket 10 is attached to the I/O PCI bracket, the combination may sometimes be referred to as a "support bracket assembly." Additionally, support bracket 10 may also be referred to as a "bracket extension" of the I/O PCI bracket as it extends the support provided by the I/O PCI bracket to the PCI card.

In use, a user may attach support bracket 10 to a I/O PCI bracket via fasteners, clinching, etc. Alternatively, the support bracket may be available already attached to a I/O PCI bracket. A user may then attach a PCI card (e.g., PCIe card) to the tabs of the I/O PCI bracket via fasteners. Once attached, the PCI card can be mounted inside the computer or server chassis.

It will be appreciated that the invention is not restricted to the particular embodiment that has been described, and that variations may be made therein without departing from the scope of the invention as defined in the appended claims, as interpreted in accordance with principles of prevailing law, including the doctrine of equivalents or any other principle that enlarges the enforceable scope of a claim beyond its literal scope. Unless the context indicates otherwise, a reference in a claim to the number of instances of an element, be it a reference to one instance or more than one instance, requires at least the stated number of instances of the element but is not intended to exclude from the scope of the claim a structure or method having more instances of that element than stated. The word "comprise" or a derivative thereof, when used in a claim, is used in a nonexclusive sense that is not intended to exclude the presence of other elements or steps in a claimed structure or method.

The invention claimed is:

1. A support bracket for a peripheral component interconnect (PCI) card, comprising:
   a first planar member having opposed first and second end portions;
   a second planar member attached to, or formed with, the second end portion, wherein the second planar member is perpendicular to the first planar member and is attachable to an I/O PCI bracket;
   a ledge attached to, or formed with, the first planar member, wherein the ledge extends between the first and second end portions and is perpendicular to the first and second planar members, and wherein the ledge is sized to support an end portion of the PCI card when the PCI card is attached to the I/O PCI bracket and when the second planar member is attached to the I/O PCI bracket;
   wherein the ledge is attached to, or formed with, a first side of the first planar member, further comprising one or more first projections attached to, or formed with, the first side of the first planar member, the one or more first projections positioned such that a channel is defined between the one or more first projections and the ledge, the channel is sized to receive an end of the PCI card; and
   where the first planar member includes a second side opposite the first side, wherein the second side includes one or more first indentations corresponding to the one or more first projections on the first side.

2. The support bracket of claim 1, wherein the one or more first projections include two or more first projections that are spaced from each other.

3. The support bracket of claim 1, wherein a second side opposite the first side of the first planar member includes one or more second projections.

4. The support bracket of claim 3, wherein the first side includes one or more second indentations corresponding to the one or more second projections on the second side.

5. The support bracket of claim 3, wherein the one or more second projections include two more second projections that are spaced from each other.

6. The support bracket of claim 1, wherein the ledge extends a substantial portion of the length of the first planar member between the first and second end portions.

7. A bracket assembly for a peripheral component interconnect (PCI) card, comprising:
   an I/O PCI bracket, including:
      an elongate base,
      two spaced tabs attached to, or formed with, the elongate base, wherein the tabs are perpendicular to the elongate base, and
      an aperture in each of the two spaced tabs sized to receive a fastener to attach the PCI card to the I/O PCI bracket; and
   the support bracket of claim 1, wherein the second planar member is attached to the base of the I/O PCI bracket.

8. The bracket assembly of claim 7, wherein the second planar member includes one or more openings, and wherein the second planar member is attached to the base via one or more fasteners received in the one or more openings.

9. The bracket assembly of claim 8, wherein the one or more fasteners are screws or rivets.

10. The bracket assembly of claim 7, wherein the second planar member is attached to the base of the I/O PCI bracket via clinching.

11. A support bracket for a peripheral component interconnect (PCI) card, comprising:
   a first planar member having opposed first and second end portions;
   a second planar member attached to, or formed with, the second end portion, wherein the second planar member is perpendicular to the first planar member and is attachable to an I/O PCI bracket;
   a ledge attached to, or formed with, the first planar member, wherein the ledge extends between the first and second end portions and is perpendicular to the first and second planar members, and wherein the ledge is sized to support an end portion of the PCI card when the PCI card is attached to the I/O PCI bracket and when the second planar member is attached to the I/O PCI bracket; and
   wherein a portion of a second side that is adjacent to the second end portion and a third side of the second planar member includes one or more additional projections that span the second side of the first planar member and the third side of the second planar member.

12. The support bracket of claim 11, wherein a portion of the first side that is adjacent the second end portion and a fourth side of the second planar member that is opposed from the third side includes one or more additional indentations corresponding to the one or more third projections.

* * * * *